United States Patent
Cohen et al.

[11] Patent Number: 6,142,641
[45] Date of Patent: Nov. 7, 2000

[54] FOUR-MIRROR EXTREME ULTRAVIOLET (EUV) LITHOGRAPHY PROJECTION SYSTEM

[75] Inventors: Simon J Cohen, Pleasonton; Hwan J Jeong, Los Altos, both of Calif.; David R Shafer, Fairfield, Conn.

[73] Assignees: Ultratech Stepper, Inc., San Jose; The Regents of the University of California, Oakland, both of Calif.

[21] Appl. No.: 09/099,571

[22] Filed: Jun. 18, 1998

[51] Int. Cl.[7] .................................................. G02B 5/10
[52] U.S. Cl. ............................................ 359/859; 359/731
[58] Field of Search .................................. 359/364, 365, 359/366, 727, 730, 731, 857, 858, 859, 861

[56] References Cited

U.S. PATENT DOCUMENTS

| | | | |
|---|---|---|---|
| 4,240,707 | 12/1980 | Wetherell et al. | |
| 4,265,510 | 5/1981 | Cook. | |
| 5,410,434 | 4/1995 | Shafer | 359/838 |
| 5,640,283 | 6/1997 | Warren | 359/859 |
| 5,815,310 | 9/1998 | Williamson | 359/365 |
| 5,973,826 | 10/1999 | Chapman et al. | 359/355 |

OTHER PUBLICATIONS

Modern Lens Design, Warren J. Smith, Mc–Graw–Hill, Inc. pp. 272, 273, 284, 285 (1992).

*Annular surfaces in annular field systems*, Jose M. Sassian Optical Engineering, vol. 36, No. 12, pp. 3401–3403 Dec. 1997.

*Four–mirror imaging system* (magnification +1/5) *for ArF excimer laser lithography*, Cheon Seog Rim et al., Optical and Quantum Electronics, vol. 27 (1995) pp. 319–325.

*Improved four–mirror optical system for deep–ultraviolet submicrometer lithography*, Jong Tae Kim et als., Optical Engineering, vol. 32, No. 3, Mar. 1993, pp. 536–540.

*Cassegrainian–inverse Cassegrainian four–aspherical mirror system* (magnification=+1) *derived from the solution of all third–order aberrations and suitable for deep–ultraviolet lithography*, Young Min Cho et al., Optical Engineering, vol. 33, No. 7, Jul. 1994, pp. 2480–2486.

*Four–mirror optical system for UV submicrometer lithography*, Sung Chan Park et al., Optical Engineering, vol. 30, No. 7, Jul. 1991, pp. 1023–1027.

(List continued on next page.)

*Primary Examiner*—Cassandra Spyrou
*Assistant Examiner*—Mark A. Robinson
*Attorney, Agent, or Firm*—Allston L. Jones

[57] ABSTRACT

The invention is directed to a four-mirror catoptric projection system for extreme ultraviolet (EUV) lithography to transfer a pattern from a reflective reticle to a wafer substrate. In order along the light path followed by light from the reticle to the wafer substrate, the system includes a dominantly hyperbolic convex mirror, a dominantly elliptical concave mirror, spherical convex mirror, and spherical concave mirror. The reticle and wafer substrate are positioned along the system's optical axis on opposite sides of the mirrors. The hyperbolic and elliptical mirrors are positioned on the same side of the system's optical axis as the reticle, and are relatively large in diameter as they are positioned on the high magnification side of the system. The hyperbolic and elliptical mirrors are relatively far off the optical axis and hence they have significant aspherical components in their curvatures. The convex spherical mirror is positioned on the optical axis, and has a substantially or perfectly spherical shape. The spherical concave mirror is positioned substantially on the opposite side of the optical axis from the hyperbolic and elliptical mirrors. Because it is positioned off-axis to a degree, the spherical concave mirror has some asphericity to counter aberrations. The spherical concave mirror forms a relatively large, uniform field on the wafer substrate. The mirrors can be tilted or decentered slightly to achieve further increase in the field size.

31 Claims, 11 Drawing Sheets

OTHER PUBLICATIONS

*Critical Illumination Condenser for EUV Projection*, Simon J. Cohen and Lynn G. Seppala, OSA Proceedings on Extreme Ultraviolet Lithography, 1994, vol. 23, pp. 109–115.

*Condenser optics, partial coherence, and imaging for soft–x–ray projection lithography*, Gary E. Sommargren and Lynn G. Seppala, Applied Optics, vol. 32, No. 34, Dec. 1993, pp. 6938–6944.

*Device profiles optics over wide spectral range*, Kristin Lewotsky, Laser Focus World, pp. 41–42, Jan. 1997.

| | radius of curvature of mirror surface (millimeters) | relative distance to next element optically upstream in system (millimeters) | k | A | B | C | D |
|---|---|---|---|---|---|---|---|
| wafer substrate 7: | infinity | 450.509085 | 0 | | | | |
| mirror 5: | -504.18336 | -250.534716 | 0 | -.114890E-09 | -.773984E-15 | .155854E-19 | -.642172E-24 |
| mirror 4: | -387.96395 | 488.948465 | 0 | 0 | 0 | 0 | 0 |
| mirror 3: | -1082.00454 | -610.602631 | 0 | .791308E-10 | .126281E-15 | .832761E-21 | 0 |
| mirror 2: | -2989.13296 | 1005.838445 | 0 | .143838E-09 | -.431179E-16 | .667192E-20 | 0 |
| reticle 6: | infinity | 0.000000 | | | | | | inner radius of field width: 52.00000 millimeters
outer radius of field width: 53.50000 millimeters

*Fig. 2*

| | radius of curvature of mirror surface (millimeters) | relative distance to next element optically upstream in system (millimeters) | k | A | B | C | D |
|---|---|---|---|---|---|---|---|
| wafer substrate 7: | infinity | 484.852138 | | | | | |
| mirror 5: | -540.52664 | -276.847904 | 0 | -.932410E-10 | -.488490E-15 | .521550E-20 | -.224952E-24 |
| mirror 4: | -399.28764 | 481.199128 | 0 | 0 | 0 | 0 | 0 |
| mirror 3: | -1144.41369 | -611.051508 | 0 | .799868E-10 | .114564E-15 | .610601E-21 | 0 |
| mirror 2: | -4529.40719 | 1159.988014 | 0 | .948732E-10 | .473317E-16 | .234624E-20 | 0 |
| reticle 6: | infinity | | | | | | | inner radius of field width: 52.00000 millimeters
outer radius of field width: 54.00000 millimeters

*Fig. 3A*

|  | XDE | YDE | ZDE | ADE | BDE | CDE |
|---|---|---|---|---|---|---|
| wafer substrate 7: |  |  |  |  |  |  |
| mirror 5: | 0.000000 | 2.817047 | 0.000000 | 0.175823 | 0.000000 | 0.000000 |
| mirror 4: | 0.000000 | -.393449 | 0.000000 | -.202802 | 0.000000 | 0.000000 |
| mirror 3: | 0.000000 | 4.445529 | 0.000000 | .271277 | 0.000000 | 0.000000 |
| mirror 2: | 0.000000 | 2.458920 | 0.000000 | -.266778 | 0.000000 | 0.000000 |
| reticle 6: | 0.000000 | -224.729218 | 0.000000 | -.535296 | 0.000000 | 0.000000 |

*Fig. 3B*

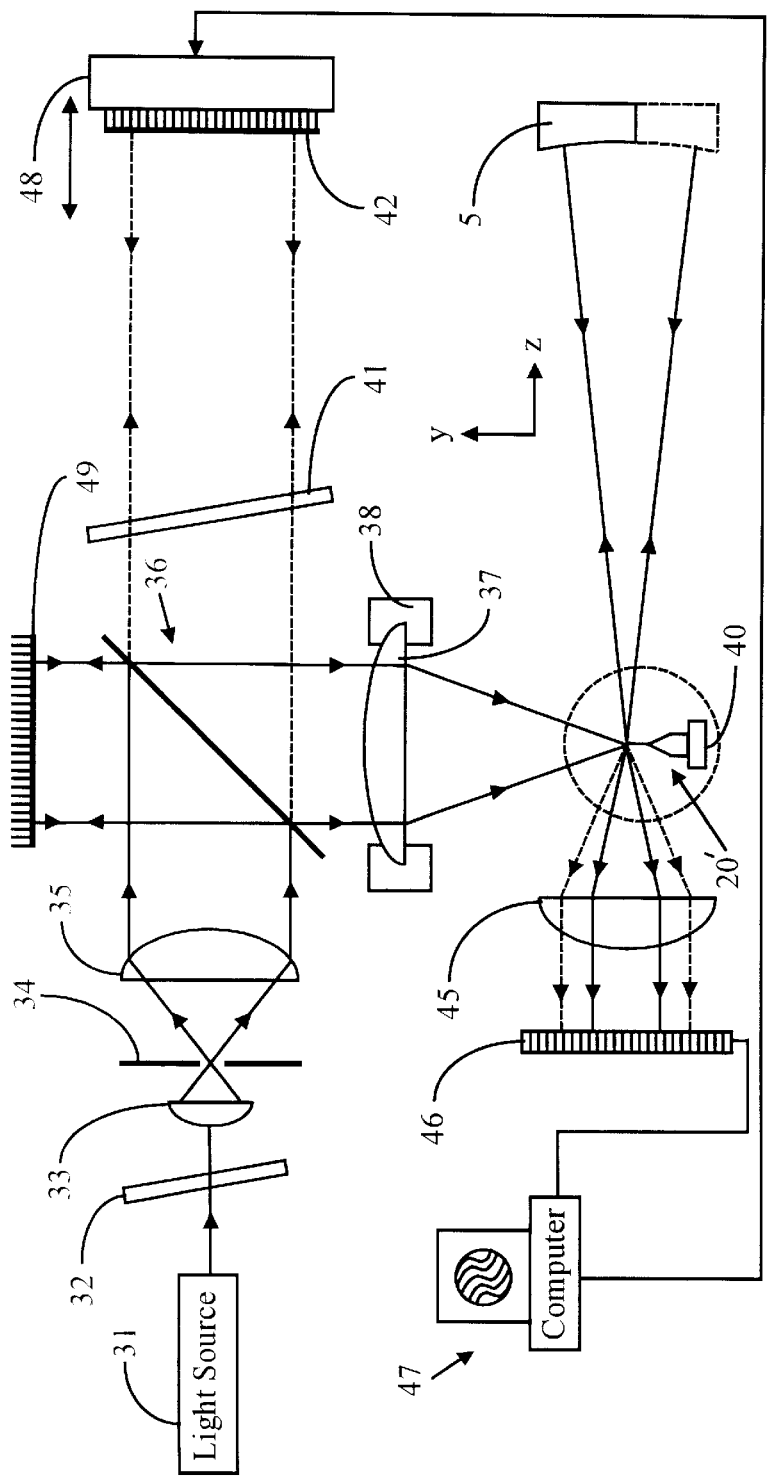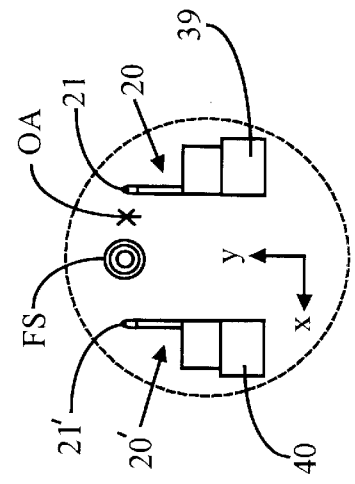
Fig. 6A
Fig. 6B

FOUR-MIRROR EXTREME ULTRAVIOLET (EUV) LITHOGRAPHY PROJECTION SYSTEM

BACKGROUND OF THE INVENTION

1. Field of the Invention

This invention is directed to a lithography projection system that can be used to transfer a pattern on a mask reticle to a wafer substrate. For example, the system can be used to pattern a resist layer in a process for forming an integrated circuit device or other features on a wafer substrate.

2. Description of the Related Art

The smallest feature size that can be formed on a substrate with a lithography system is proportional to the wavelength of light used in the system. The current state-of-the-art systems use light wavelengths in the deep ultraviolet (DUV) range on the order of hundreds of nanometers, and are thus inherently capable of forming features sizes with smallest dimensions on the order of several tenths of microns. With the ongoing demand in integrated circuit and other industries for smaller features sizes, it would be desirable to overcome the inherent limitations of existing lithography projection systems, and to provide a system capable of producing feature sizes on the order of 0.1 micron or less. This would require using light wavelengths in the extreme ultraviolet (EUV) range.

Of some relevance to this invention are four-mirror catoptric systems that have been proposed for use in the performance of DUV lithography. Examples of these kinds of systems are disclosed in *Four-mirror imaging system (magnification+⅕) for ArF excimer laser lithography*, Cheon Seog Rim et al., Optical and Quantum Electronics, Vol. 27 (1995), pages 319–325, *Improved four-mirror optical system for deep-ultraviolet submicrometer lithography*, Jong Tae Kim et al., Optical Engineering, Vol. 32, No. 3, March 1993, pages 536–540, *Cassegrainian-inverse Cassegrainian four-aspherical mirror system (magnification=+1) derived from the solution of all zero third-order aberrations and suitable for deep-ultraviolet optical lithography*, Young Min Cho et al., Optical Engineering, Vol. 33, No. 7, July 1994, pages 2480–2486, and *Four-mirror optical system for UV submicrometer lithography*, Sung Chan Park et al., Optical Engineering, Vol. 30, No. 7, July 1991, pages 1023–1027. Although these systems are asserted to be useful in the performance of DUV lithography in the above-listed publications, they are specially configured for use at DUV wavelengths, and as such are incapable of functioning effectively at EUV or shorter wavelengths to achieve integrated device feature sizes on the order of 0.1 microns or less. It would be desirable to overcome these disadvantages of previous lithography projection systems.

SUMMARY OF THE INVENTION

The invented lithography projection system overcomes the above-noted disadvantages. The invented system can be used for the performance of EUV lithography to form integrated device features on the order of 0.1 micron or less. The invented system includes four mirrors which are disposed along an optical axis between the mask reticle and the wafer substrate. Preferably, the four mirrors include a dominantly hyperbolic convex mirror, a dominantly elliptical concave mirror, a substantially spherical convex mirror, and an approximately spherical concave mirror. The mirrors can be sections of surfaces that are axially-symmetric, or approximately so, with respect to the optical axis. The system can include an EUV light source and optical condenser that irradiates the reflective reticle at an oblique angle that allows the light source and condenser to be spaced apart from the system's mirrors. Patterned light reflected from the reticle travels to the convex hyperbolic mirror. Along the system's optical axis, the hyperbolic mirror is physically closest to the wafer substrate and farthest from the reticle as compared to the other mirrors in the system. The hyperbolic mirror reflects the patterned light to the concave elliptical mirror. As viewed along the optical axis, the elliptical mirror is positioned closest to the reticle and farthest from the wafer substrate as compared to the other mirrors. Both the hyperbolic and elliptical mirrors are located on the same side of the system's optical axis as the reticle. Light reflected from the elliptical mirror travels to the convex spherical mirror. The convex spherical mirror is disposed on the system's optical axis. The convex spherical mirror is positioned between the hyperbolic and elliptical mirrors along the system's optical axis, and is closer to the hyperbolic mirror than the elliptical mirror. Light reflected from the convex spherical mirror travels to the concave spherical mirror. The concave spherical mirror is positioned on the opposite side of the system's optical axis from the hyperbolic and elliptical mirrors and the reticle, but on the same side of the optical axis as the wafer substrate. Along the optical axis, the spherical concave mirror is positioned between the spherical convex and elliptical mirrors. The spherical concave mirror is positioned to receive light reflected from the spherical convex mirror, and reflects this light to the wafer substrate. The image field produced by the system on the substrate is arcuate in shape and covers a relatively large area of a few centimeters by a few millimeters, for example, and is thus of sufficient size to form many very large scale integrated (VLSI) circuits such as 256 Megabyte dynamic random-access memory (DRAM) circuits.

The system can include an aperture stop or pupil on the convex spherical mirror, which allows for adjustment of the system's numerical aperture and hence resolution. The concave spherical mirror renders the system telecentric on the wafer plane, which is desired to prevent lateral image displacement if the wafer is inadvertently defocused. Further, the system is preferred to have a magnification that allows the mask reticle to be several times larger in scale than the pattern transferred to the substrate so that manufacture of the reticle is facilitated. Also, the mirrors can be tilted and/or decentered with respect to the system's optical axis to increase the field size at the wafer substrate. Furthermore, the system is configured so that the incident angle of light to the mirrors is 15° or less. This feature makes it possible for multilayer reflective coatings to function properly to reflect EUV light. In addition, the system can include one or more stages used to support and position the reticle, wafer substrate, and mirrors to facilitate their alignment. The wafer stage can be used to scan the reticle pattern onto the substrate, preferably in a step-and-scan fashion. The system can also include stages for the reticle and wafer. The even number of mirrors in the system places the system's reticle and wafer stages on opposite sides of the system so that they can be moved without interfering with one another. Also, by angling the light supplied from the light source to the reticle, the system's light source can be spaced apart from the mirrors with sufficient clearance so that vignetting of imaging light is prevented and so that the mirrors and light source can be positioned without interfering with one another.

The curvatures and spacings of the mirrors can be determined by a gross optimization step followed by a fine optimization step. In the gross optimization step, the higher order terms of asphericity for all mirror surfaces are set to zero, and the lower order terms, radius of curvature and mirror spacings are allowed to vary in determining an approximate system solution. The approximate solution is used as the initial condition in the fine optimization step in which higher order asphericity terms, in addition to the lower-order sphericity terms, the radii of curvature and the mirror spacings, are allowed to vary to obtain the final system solution. In the fine optimization step, to increase the size of the field at the wafer substrate, the mirrors can be allowed decenter and tilt degrees of freedom in addition to the other variables to achieve the final system solution.

Due to the number of degrees of freedom in the invented system, it is possible to change the locations of mirrors during optimization of the system. For example, the hyperbolic convex mirror can be positioned along the optical axis between the convex and concave spherical mirrors. Also, the hyperbolic convex mirror can be positioned behind the wafer plane, or the elliptical convex mirror can be positioned in front of the spherical convex mirror with respect to the system's optical axis.

These, together with other features and advantages, which will become subsequently apparent, reside in the details of construction and operation of the invention as more fully hereinafter described and claimed, reference being made to the accompanying drawings, forming a part hereof, wherein like numerals refer to like parts throughout the several views.

BRIEF DESCRIPTION OF THE DRAWINGS

FIG. 2 is a table of a prescription for an exemplary axially-symmetric system of the present invention;

FIGS. 3A and 3B are tables of a prescription for an exemplary non-axially symmetric system of the present invention, with mirror tilt and decenter to increase image field width at the wafer substrate;

FIGS. 6A and 6B, 7, 8, and 9 views of pin mirror interferometers used to test the shapes of the mirrors used in the system of the present invention.

DESCRIPTION OF THE PREFERRED EMBODIMENTS

1. The Invented Lithography Projection System

Figure 1:
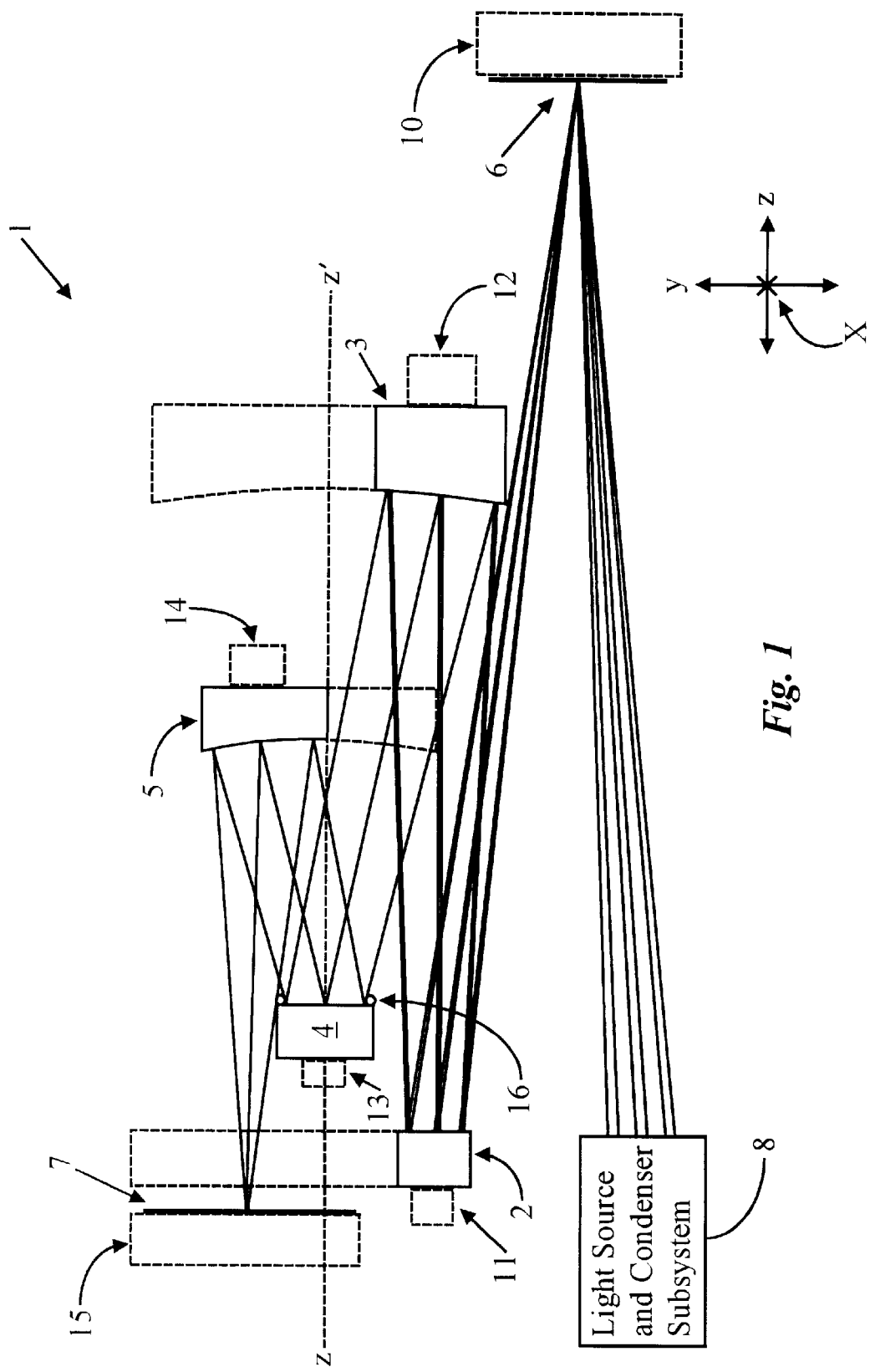
FIG. 1 is a view of a lithography projection system in accordance with the present invention.

In FIG. 1, the system 1 includes mirrors 2, 3, 4, 5 used to transfer a pattern on a reticle 6 to a wafer substrate 7. The invented system can also include a light source and condenser subsystem 8 for generating and directing light to the reticle. In addition, the system can include stages 10 through 15 used for relative positioning of the reticle, mirrors 2 through 5, and the wafer substrate 7, respectively. The system can also include an aperture stop or pupil 16 positioned at the mirror 4, whose possible configurations and operation are well-known to persons of ordinary skill in this technology. Preferably, the subsystem 8, mirrors, and stages are mounted and supported in a common chassis or housing (not shown) or on a table surface (not shown), for example.

The light source of the subsystem 8 generates light, preferably at extreme ultraviolet (EUV) or shorter wavelengths to produce feature resolutions at the wafer substrate of 0.1 micron or less. For example, the light source can be a synchrotron radiative source from an electron storage ring controlled by a magnetic field or a laser-induced plasma generated by directing a high-repetition rate pump laser onto a continuously sequencing target. Each of these sources can emit EUV radiation at a wavelength of approximately 13.0 nanometers for use with the invented projection system.

The light source is followed by an optical condenser that is included within the subsystem 8, which projects uniform illumination to a pattern on a reticle that is desired to be transferred to the substrate. The field of light formed on the reticle by the subsystem 8 is referred to herein as the 'object field.' The condenser can be either a critical or Köhler illumination optical system. Examples of these kinds of systems are disclosed in *Condenser optics, partial coherence, and imaging for soft-x-ray projection lithography*, Gary E. Sommargren and Lynn G. Seppala, Applied Optics, Vol. 32, No. 34, December 1993, pages 6938–6944, or Simon J. Cohen and Lynn G. Seppala, *Critical Illumination Condenser for EUV Projection Lithography*, OSA Proceedings on Extreme Ultraviolet Lithography, 1994, Vol. 23, pages 109–115.

The reticle used in the invented system is a reflective type because EUV light is of such short wavelength that it is absorbed upon refraction in virtually all materials. A transmission mask could be made from a germanium absorbing layer which is patterned on a silicon membrane that has been doped with boron. However, reflective masks generated from periodic multi-layer stacks of molybdenum/silicon (or possibly molybdenum/beryllium) will work more effectively with the invented system. The reflective reticle pattern can be created by reactive ion etching (RIE) directly into the multi-layers, or etching on thin layers of gold or germanium about 100 nanometers in thickness, which overlay the molybdenum/silicon stack. The mask writer generates a reticle pattern in either a positive or negative sense, depending upon the resist type used on the wafer substrate 7. The stage 10 is preferably such that the reticle can be removably secured thereon so that different reticles in a mask set can be interchanged as necessary to expose different levels of the integrated circuit. Such reticle mountings for the stage 10 and their operation are well-known in this technology. As with the other stages described herein, the stage 10 is preferably an x-y-z stage capable of orienting the reticle 6 in three orthogonal dimensions with relatively high precision. With the stage 10, the reticle 6 can be positioned relative to the light source and condenser subsystem 8 so as to irradiate the reticle 6 with EUV light at an oblique angle, a feature that allows the light source to be spaced apart from the mirrors of the present invention so that light is not undesirably blocked. The light from the subsystem 8 reflects from the reflective portions and is absorbed in non-reflective portions of the reticle. The light reflected from the reticle is thus patterned light which travels toward the mirror 2, the first of the four mirrors situated optically between the reticle and the wafer substrate 7.

As previously mentioned, EUV light is absorbed significantly upon refraction into virtually all materials. Therefore, the invented system is catoptric (i.e., includes only reflective elements). The election to use four mirrors in the invented system is based upon several design considerations. For one, an even number of mirrors is preferred because this places the reticle and wafer on opposite sides of the system so that their stages 10, 15 do not interfere with one another. A two-mirror system, however, cannot form an image of sufficient size and quality to form many circuits with relatively high integration densities. However, each additional mirror used in the system causes 20% to 30% of the incident light to be lost. Furthermore, each additional mirror introduces additional cost and complexity in the manufacture and alignment of the invented system. In balancing these considerations, four mirrors are optimal for use in the invented system.

As is shown in FIG. 1, the preferred mirror configurations can be viewed as sections of larger mirror surfaces that are at least approximately axially symmetric about the system's optical axis Z-Z', as indicated in broken lines. In some cases, however, the mirror surfaces may not be perfectly axially symmetric about the optical axis, particularly in the circumstance in which relatively small decenters or tilts of the mirrors with respect to the optical axis are used to increase the image field width at the wafer substrate. Such decenters or tilts will later be described in more detail with respect to Example 2 of the invented system. In general, the mirrors 4, 5 which are positioned relatively near the system's optical axis Z-Z' have spherical or approximately spherical shapes, whereas the mirrors 2, 3 which are relatively distant from the optical axis, have relatively complex surface shapes to counter system aberrations which occur due to the off-axis position of these mirrors. The preferred configurations for the mirrors 2, 3, 4, 5 are therefore dominantly hyperbolic convex, elliptical concave, spherical convex, and spherical concave, respectively, although the present invention is not necessarily limited to these mirror configurations. To ease constraints in writing a pattern on the mask reticle, the mirrors are preferred to be configured with a magnification in which the scale of the reticle pattern is greater than one times, and preferably several times, the size of the pattern to be formed on the wafer substrate. Also, the mirrors are configured so that the mirrors 2, 3 are on the same side of the system's optical axis as the object field at the reticle, and the mirror 5 is positioned on the opposite side of the optical axis together with the image field at the wafer substrate. The mirror 4 is positioned on the system's optical axis.

The light source and reticle are oriented with respective stages so that patterned light reflected from the reticle travels to the mirror 2. Relative to the system's optical axis Z-Z', the mirror 2 is positioned closest of all the mirrors to the wafer substrate 7 and farthest from the reticle 6. The mirror 2 reflects light received from the reticle, to the mirror 3. Like the other mirrors 3–5, the mirror 2 preferably has a reflective surface formed of multiple layers. The reflective surface is preferably supported by a relatively thick, and therefore stable, block of material on the order of many inches in thickness. The mirror 2 is positioned with respect to the reticle 6 and the mirror 3 with a stage 11 to which the mirror 2 is mounted so as to reflect patterned light received from the reticle, to the mirror 3.

The mirror 3 reflects patterned light received from the mirror 2, to the mirror 4. The mirror 3 can be positioned so as to reflect light from the mirror 2 to the mirror 4 using the stage 12 to which the mirror 3 is mounted. The mirror 4 receives patterned light from the mirror 3, and reflects this light to the mirror 5. The mirror 4 can be mounted to the stage 13 for positioning of the mirror 4 to reflect the light received from the mirror 3, to the mirror 5. The system preferably includes an aperture stop or pupil 16 that defines the clear surface of the mirror 4, and hence the numerical aperture of the system. The unit 16 is preferred to be a pupil to allow adjustment of the system's numerical aperture, and hence resolving power. The manufacture and use of such aperture stops or pupils are well-known to persons of ordinary skill in this technology.

The mirror 5 is mounted on the stage 14 for positioning to reflect and focus patterned light from the mirror 4, to the image field at the wafer substrate 7. The mirror 5 also makes the wafer substrate side of the system telecentric, i.e., all chief rays are perpendicular to the wafer surface. The telecentricity on the wafer substrate side of the system prevents image shift during exposure that can be caused by inadvertent wafer motion in the direction of the optical axis. This feature reduces overlay errors in a process for forming a device with stacked layers. The patterned light from mirror 5 can be used to irradiate a resist layer on the substrate. As is well-known in this technology, the resist layer can subsequently be developed and subjected to a process step such as chemical vapor deposition, sputtering, etching, doping, ion implantation, laser irradiation or the like, to form an integrated device. The image field produced by the system can be relatively large, on the order of a few millimeters by a few centimeters, or larger, and thus of sufficient size to produce relatively large-scale integration densities. The wafer substrate 7 is of course removably mounted to the stage 15 to allow processing of different wafers. The stage 15 can operate to position the wafer substrate with respect to the image field of patterned light in a step-and-scan fashion, for example.

In the design of the invented system, the curvature and relative positions of the mirrors 2–5 and reticle 6 with respect to the wafer substrate 7, are determined so as to achieve optimal focus of the object plane at the reticle, to the image plane at the wafer substrate. The preferred method for system optimization involves a gross optimization (or adjustment) step followed by a fine optimization (or adjustment) step. The preferred method for mirror curvature and relative position optimization can be better understood in reference to the following equation for the sag or curvature of a mirror surface:

$$z = \frac{ch^2}{1 + \{1 - [(1+k)c^2h^2]\}^{1/2}} + Ah^4 + Bh^6 + Ch^8 + Dh^{10} \quad (1)$$

where z is the sag of the surface along an axis parallel to the optical axis Z-Z', c is the surface vertex curvature (which is equal to the reciprocal of the radius of curvature), k is the conic constant, A, B, C, and D are the 4th-, 6th-, 8th-, and 10th-order aspherical coefficients of deformation, and $h^2=x^2+y^2$, where x and y are axes orthogonal to the optical axis Z-Z'. In the gross optimization step, the constants B, C, and D for all mirrors are set to zero, and the constants c and A (or k instead of A) for all mirrors, as well as their relative distances along the optical axis, are allowed to vary to a achieve a solution to the system constraints. Gross optimization can be performed using aberration theory as described, for example, in "Reflective Optics," by Dietrich Korsch, Academic Press, Inc. (1991) or "Modern Lens Design: A Resource Manual," McGraw-Hill, Inc. (1992), or more preferably, by using a computer running an optical system design software package such as CODE V commercially available from Optical Research Associates, Inc. of Pasadena, Calif. The gross optimization step generates a solution for the mirrors' curvatures, lowest order aspheric coefficients and relative spacings along the optical axis, and is performed prior to fine optimization to avoid trapping the solution at local minima which have larger aberrations than desired for the system.

In fine optimization, the higher-order aspherical coefficient terms B, C, and D, in addition to the constants c and A, are permitted to vary for all mirrors in the system, in addition to their relative spacings along the optical axis, to determine the final mirror shapes and positions for the system. The mirror shapes and positions as determined by the gross adjustment step, are used as initial conditions for the fine optimization step. The fine adjustment step is computationally intensive, and thus it is preferred to be performed with a computer running a software package such as the aforementioned CODE V. The fine optimization step yields the final optimized configuration for the system that produces the least aberration and distortion of the light traveling from the reticle to the wafer substrate. The solution obtained through fine optimization can also be performed so as to include additional degrees of freedom for mirror tilt and decentration relative to the optical axis to increase the size of the image field of patterned light formed on a resist layer at the wafer substrate.

EXAMPLE 1

A prescription for an exemplary axially-symmetric system of this invention is shown in the table of FIG. 2. In this example, the EUV wavelength of light used in the system is 13.1 nanometers, but as a reflective optical system, other wavelengths can be used. The numerical aperture is 0.1 to achieve 0.1 micron resolution, the field size at the wafer is 26 millimeters by 1.5 millimeters, the magnification is negative 4×, the wavefront error is 0.03 root-mean-square waves or less on every field point to achieve diffraction-limited imaging performance, and the distortion is ten nanometers or less to reduce overlay errors and to prevent image blurring during scanning. The table gives the radius of curvature which for all surfaces is negative to indicate that the center of curvature is to the left of the mirrors' vertexes for all mirror. The mirrors' vertexes are either the points at which the mirror surfaces meet with the optical axis Z-Z' as is the case with mirrors 4 and 5 in FIG. 1, or the points at which the symmetrical projections of the mirror surfaces intersect with the optical axis Z-Z', as shown in broken line for mirrors 2, 3 in FIG. 1. The relative distance is given in terms of the distance from the wafer or a mirror to the next mirror upstream along the optical path starting from the wafer substrate and ending at the reticle. Thus, the mirror 5 is located 450.509085 millimeters in the positive direction (i.e., to the right in FIG. 1) of the wafer substrate along the optical axis, the mirror 4 is positioned −250.534716 millimeters in the negative direction (i.e., to the left in FIG. 1) along the optical axis from the mirror 5, and so forth. FIG. 2 also gives the coefficients A, B, C, and D for all mirrors (with the conic constant k equal to zero) as defined in equation (1), as well as the relative spacings of the mirrors, determined by gross optimization followed by fine optimization of these variables.

The prescription of FIG. 2 completely defines the system. The mirrors 2–5 are accordingly formed according to the specifications given in FIG. 2 and the reticle, mirrors, and wafer substrate are positioned relative to one another using respective stages to achieve the spacings prescribed in FIG. 2. Note that in FIG. 2, the radial width of the image field extends from 52.0 to 53.5 millimeters from the optical axis, and is thus 1.5 millimeters wide. Although this width is sufficient to form many integrated circuits, an increase in field size can be achieved in a non-axially symmetric system as described in the following example.

EXAMPLE 2

FIGS. 3A and 3B are tables for a non-axially symmetric system of this invention, in which the basic specifications (i.e., EUV light wavelength, numerical aperture, etc.) are similar to those of Example 1 except as otherwise indicated. Fine optimization is performed so as to include degrees of freedom for mirror tilt and decenter of the mirror surfaces relative to the system's optical axis, in addition to the radius of curvature, the coefficients A, B, C, and D for each mirror surface, and the relative spacings of the wafer substrate, reticle, and mirrors in the system. The decentering of the mirrors is performed along the y-axis which is orthogonal to the optical axis (see FIG. 1), as indicated under the column YDE (FIG. 3B). Mirror tilts are performed in degree units (in which 90 degrees equals $\pi/2$ radians) about the x-axis, as indicated by the degree values under column ADE (FIG. 3B). A positive tilt value indicates that the tilt is in a counterclockwise sense about the x-axis (see FIG. 1 in which the positive x-axis extends perpendicularly into the plane of the Figure, and the negative x-axis extends perpendicularly out of the plane of the Figure, as indicated by the 'X' mark at the origin of the orientation axes). A negative tilt value indicates that the mirror tilt is in a clockwise sense about the x-axis. To reduce unnecessary complexity, the decenter variables XDE and ZDE along the x-axis and the optical axis, respectively, and the tilt variables BDE and CDE about the y- and z-axes in FIG. 1, respectively, are set to zero. Note that the field width extends from a radius of 52 millimeters to a radius of 54 millimeters from the optical axis, for a total field width of 2.0 millimeters while maintaining the same wavefront and distortion constraints, an increase of 0.5 millimeters over the field width of the axially symmetric system of FIG. 2.

2. Alignment and Testing of Mirrors in the Invented System

A. Mirror Alignment Testing

As the prescriptions of FIGS. 2, 3A and 3B indicate, the mirror curvature is subtle and the mirror alignment (i.e., relative spacings and orientation such as tilt or decenter) are relatively precise in the invented system. Although conventional surface curvature and alignment testing devices can be useful to an extent in manufacturing the mirror surfaces with proper surface shapes, and in their positioning and orientation in the invented system, the full capabilities of the invented system can best be obtained using state-of-the-art testing equipment. One possible device for use in testing mirror alignment is the phase-shifting diffraction interferometer produced by Lawrence Berkeley Laboratory of Berkeley, Calif., which is described in an article "Device profiles optics over wide spectral range," Kristin Lewotsky, Laser Focus World, pages 41–42, January 1997. Another option for use in testing mirror alignment in the invented system is the pin mirror interferometer disclosed in U.S. application Ser. No. 08/806,663 filed Feb. 26, 1997, naming Hwan J. Jeong and David A. Markle as inventors, and assigned to Ultratech Stepper, Inc., one of the same entities as the present invention. A description of the relevant portion of the pin mirror interferometer follows because there has been no publication of such interferometer as of the filing date of this application.

Figure 4A:
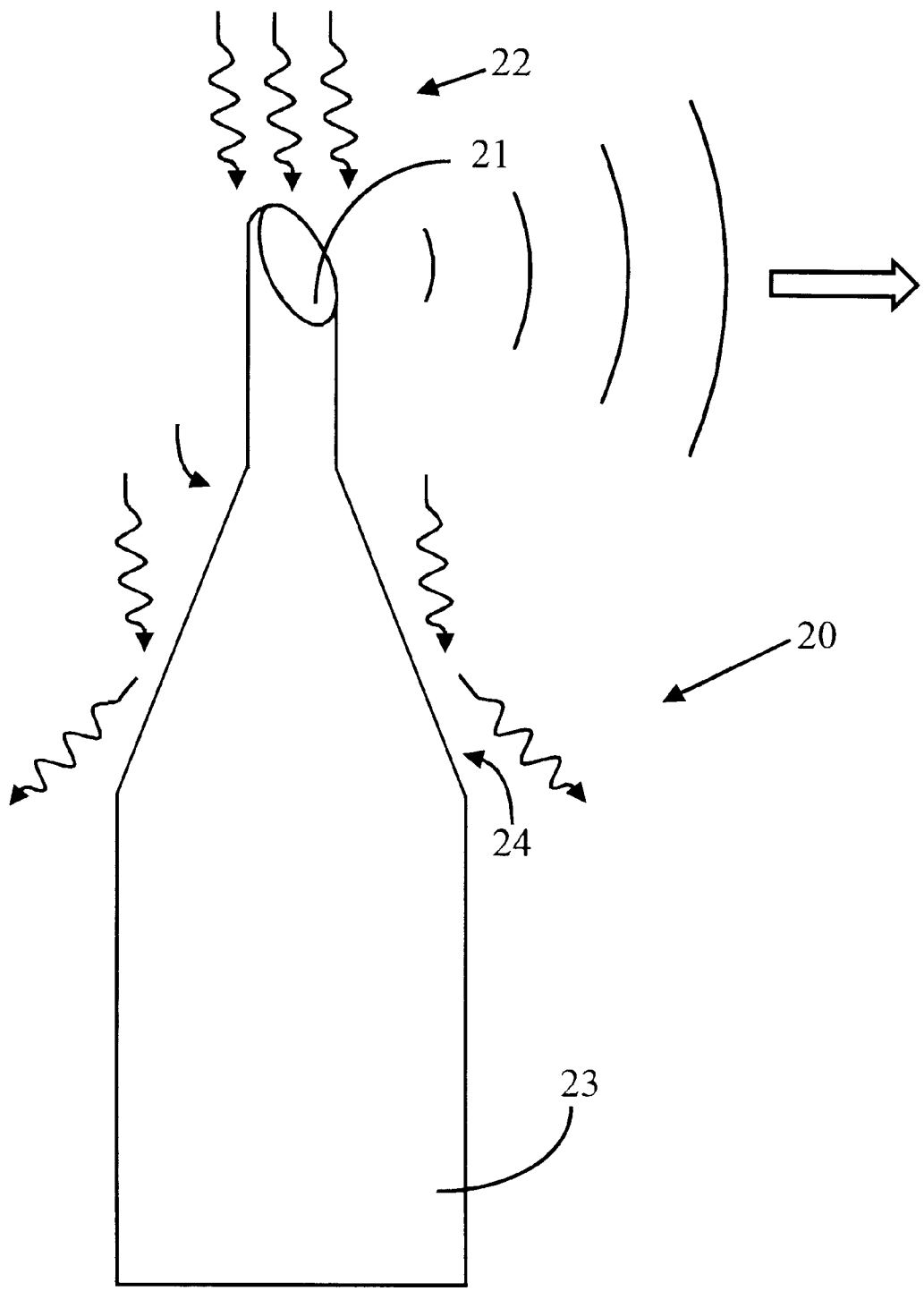
FIGS. 4A and 4B are views of embodiments of pin mirrors for use in interferometers for testing surface curvature and alignment of the mirrors of the system of the present invention.

FIG. 4A is a first embodiment of a pin mirror 20 used in the pin mirror interferometer. The pin mirror has a reflective surface 21 defined at its end, that diffracts light 22 incident to the reflective surface to generate light with a diffraction-limited spherical wavefront. The pin mirror can be arranged relative to the light's incidence direction so that the diffracted light is reflected from the pin mirror's reflective surface in a predetermined direction. The pin mirror has the capability to diffract and reflect the light in a desired direction. The pin mirror can be formed from a relatively thin, elongated pin-like member. The pin mirror is preferably formed of a rigid material so that the pin mirror can be readily fixed in position. Due to its thinness, and hence relative fragility, the pin mirror should also be made of relatively durable material. For example, the pin mirror can be formed from an appropriate reflective metal. Alternatively, some dielectric materials such as glass fibers or crystals can be used for the pin mirror, and these materials can yet reflect sufficient light to be used effectively. The reflective surface is preferably made by polishing the end of the pin mirror to a flat surface whose normal is centered between the light's incidence and reflected directions when the pin mirror is properly positioned to receive the incident light. Alternatively, the surface can be substantially convex to diffract the light over a broad solid angle. In other words, the convex pin mirror surface generates a relatively high numerical aperture beam. If the pin mirror is made of a dielectric material with a reflection efficiency that is insufficient, the reflective surface can be coated with an appropriate dielectric material to increase its reflectivity.

The largest dimension across the reflective surface 2 should be less than $\lambda/NA$, where $\lambda$ is the wavelength of the test light which is preferably a visible wavelength, and where NA is the numerical aperture of the lithography projection system of the present invention to be analyzed by an interferometer incorporating the pin mirror. This constraint on the size of the pin mirror's reflective surface ensures that the reflected surface will diffract light with a numerical aperture adequate to effectively measure the alignment of the mirrors 2–5 in the system of the present invention. Irregularities in the surface shape of the pin mirror's reflective surface can impact the light intensity distribution, but not the sphericity, of the diffraction-limited wavefront generated by the pin mirror. Nonetheless, it is preferred that the pin mirror's surface be relatively smooth to produce a wavefront with uniform intensity as well as sphericity.

The irradiation of the reflective surface 21 with the incident light 22 can heat the pin mirror as high as 100° Celsius or more. The heated pin mirror heats the air in proximity to the reflective surface, causing distortions of the wavefront of the light diffracted by the pin mirror's reflective surface. To prevent such distortions, the pin mirror can be mounted or soldered to, or formed integrally with, a base 23 that has a relatively large volume to serve as a reservoir for heat generated by the pin mirror, and that also has a relatively large area to dissipate heat in locations sufficiently distant from the pin mirror's reflective surface so as not to disturb the spherical wavefront generated by the reflective surface. If the pin mirror is made of a material that heats significantly upon irradiation with the incident light, to allow significant transfer of heat away from the pin mirror's reflective surface, both the pin mirror and the base in the embodiment of FIG. 4A should preferably be made of a material with a relatively high thermal conductivity, such as metal.

Preferably, the base has shoulders 24 that taper outward from the bottom end of the pin mirror in FIG. 4A. As so tapered, the shoulders are angled to reflect stray light in a direction away from the diffracted light generated by the pin mirror so that its spherical wavefront is not disturbed by the stray light.

Figure 4B:
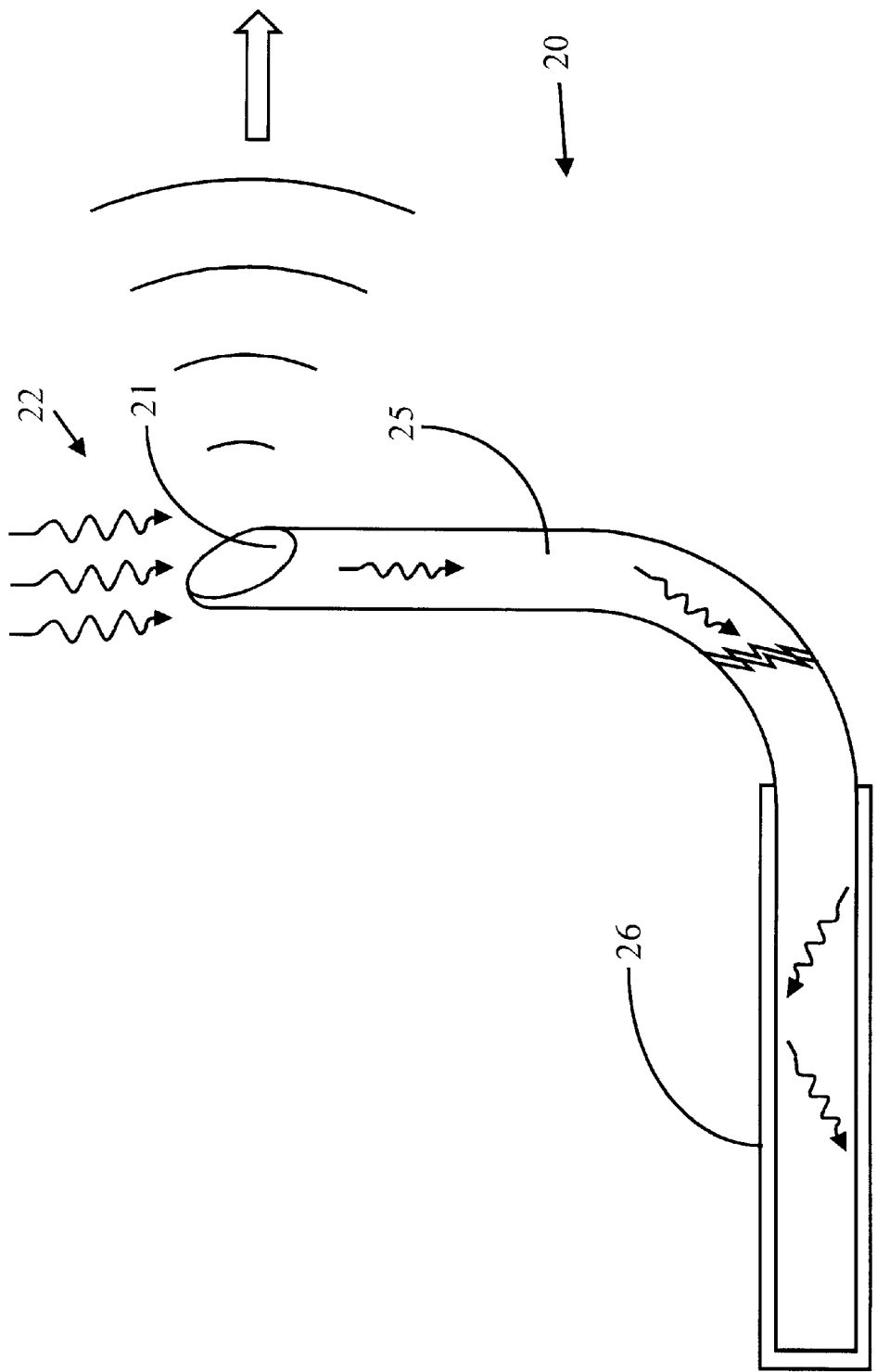

FIG. 4B is a second embodiment of the pin mirror 20. The pin mirror of FIG. 4B includes a fiber 25 that transmits light in its interior along its longitudinal axis. The fiber 25 has a reflective surface 21 that is similar in configuration and function to that of the pin mirror of FIG. 4A. More specifically, the reflective surface of the fiber 25 reflects and diffracts incident light to generate a diffraction-limited spherical wavefront. The fiber's reflective surface reflects about 5% to 25% of the incident light, depending upon the refractive index of the fiber material, the incidence angle and the incident light's polarization status. The remaining 95% to 75% of the light incident to the reflective surface refracts into the fiber 25, and a significant portion, if not all, of the refracted light travels through the fiber 25. Because the fiber 25 is transmissive, the light is not significantly absorbed by the fiber in proximity to the reflective surface, and accordingly, the fiber generates no appreciable heat that would adversely affect the spherical wavefront of the diffracted light generated by the reflective surface.

The second end of the fiber 25 opposite the surface 21 transmits light to a light trap 26 shown in cross-section in FIG. 4B, that encloses the fiber's second end. The light trap encloses the fiber's second end in a light-tight manner to prevent the escape of light from the trap. Also, the light trap has opaque walls to absorb the light to prevent appreciable transmission of the light back into the fiber 25 after the light enters the trap.

The pin mirror of FIG. 4B can be made using a conventional single mode optic fiber as a starting material. However, conventional optic fibers have core diameters that are much larger than $\lambda/NA$ for typical test light wavelengths $\lambda$ (i.e., at visible or shorter wavelengths) and the numerical aperture NA of the lithography projection system of the present invention, and must be reduced significantly in size to produce the reflective surface of the pin mirror so that it is sufficiently small to diffract light incident to the surface. The pin mirror's fiber 25 can be formed from a single mode optic fiber by removing the cladding and much of the core of the fiber by etching with an acid solution, for example, until the fiber has a diameter sufficiently small so that the reflective surface 21 can be made substantially on the entire end surface of the fiber with its largest cross-surface dimension smaller than $\lambda/NA$. More preferred, however, the pin mirror of FIG. 4B is formed by heating a single mode optic fiber to a relatively high temperature at which the fiber becomes at least partially molten, and by pulling the heated fiber to stretch the fiber along its longitudinal axis to reduce the fiber's diameter. The fiber is cut and polished to form the reflective surface angled so that incident light is reflected in the desired direction when the fiber 25 is fixed in position. The cladding of the fiber is preferably kept on the optic fiber until the end is polished to form the reflective surface, after which the cladding and part of the core, if necessary, can be removed by etching, for example, to reduce the cross-width size of the reflective surface below $\lambda/NA$.

A light trap 26 can be made by forming a light-absorbent coating such as an opaque paint or the like, on the end of the fiber 25. The trap's coating is formed uniformly around the entire fiber circumference over a length of the optic fiber sufficiently large to absorb all of the light traveling in the fiber. Preferably, in the region to which the light trap is applied to the fiber, the cladding of the fiber 25 has been removed so that the fiber leaks light. Also, the coating should absorb a broad spectrum of light wavelengths (from extreme ultraviolet to visible wavelengths, for example) but should at least absorb the light wavelength(s) with which the pin mirror is intended to be used. Further, to prevent the fiber from heating significantly, the coating is preferably applied over a relatively large area so that enough heat can be dissipated from the coating when heated by the absorption of light traveling in the fiber, so that the reflective surface at the fiber's opposite end is not significantly heated to prevent disturbance of the spherical wavefront generated by diffraction of light incident to the reflective surface. However, the coating is applied relatively distant from the reflective surface to prevent the heat generated and dissipated at the coating from disturbing the wavefront of the light diffracted from the reflective surface. The length of the coating that must be applied to the fiber to absorb all light can be determined by calculating the amount of light entering the fiber and the amount of light leakage from the fiber per unit fiber length, either theoretically or by measurement, and by substituting these calculated amounts into Beer's law.

Figures 5A, 5B:
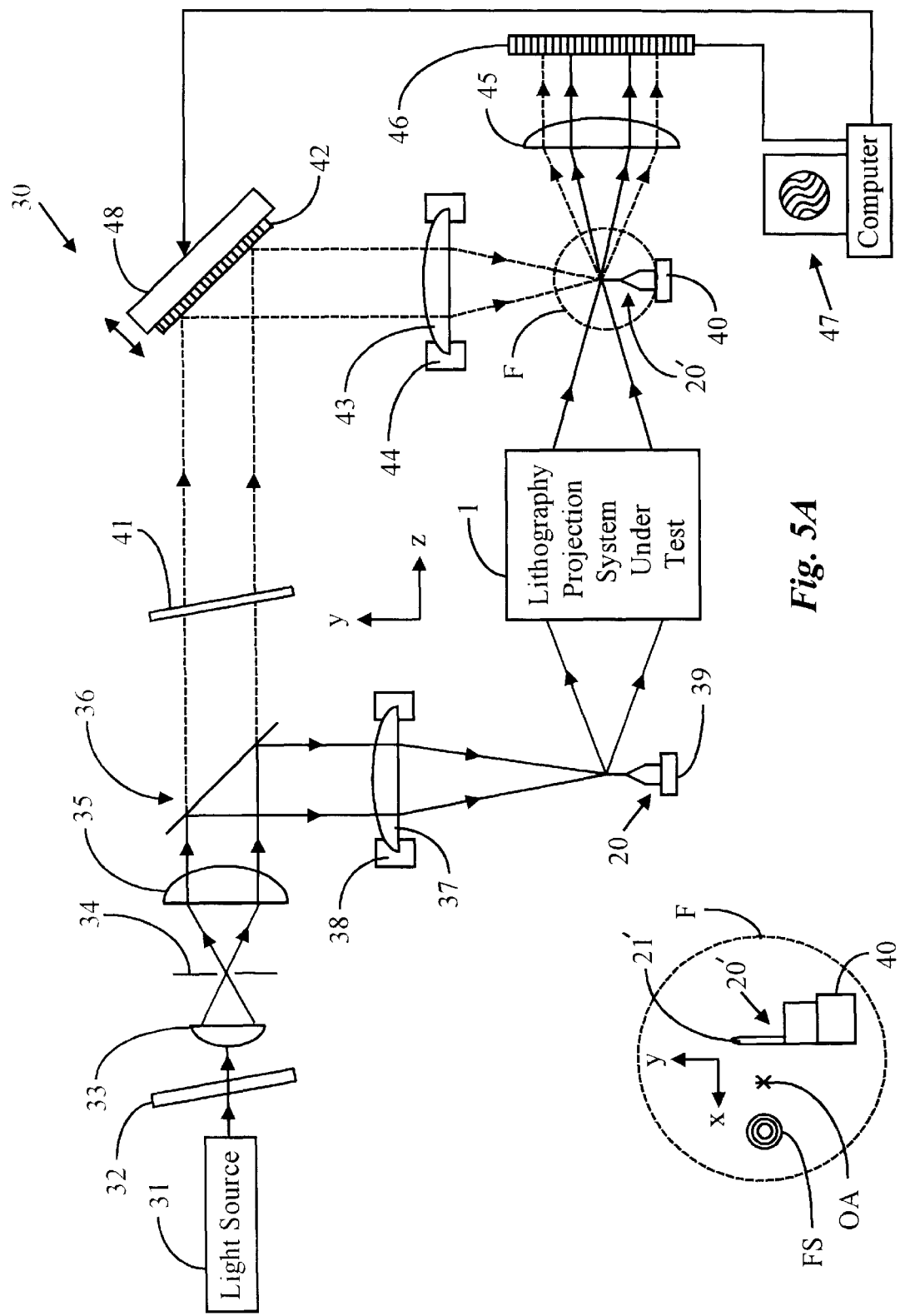
FIGS. 5A and 5B are views of the pin mirror interferometer preferred for use in testing mirror alignment in the system of the present invention.

The pin mirror interferometer 30 of FIGS. 5A and 5B is useful for testing the alignment of the four mirrors used in the lithography projection system of the present invention. The view of FIG. 5A is presented in the y-z plane, and FIG. 5B corresponds to the region F of FIG. 5A viewed in the x-y plane. In the pin mirror interferometer of FIGS. 5A and 5B, light at visible to UV wavelengths is generated by source 31, and can be attenuated to a fraction of its source intensity by attenuator 32 to prevent saturation of the interference pattern generated by the interferometer. The light from the attenuator is expanded by lenses 33, 35 and filtered by filter 34. The lens 35 generates collimated light supplied to the input side of beam splitter 36. Light reflected from the beam splitter's partially-reflective, partially-transmissive interface travels as the probe beam to focusing lens 37. The lens 37 focuses the probe beam onto the probe pin mirror 20. A stage 38 can be used to move the lens 37 toward or away from the probe pin mirror, to adjust the focus of the light supplied to the probe pin mirror 20. The probe pin mirror diffracts and reflects the probe beam in a direction toward the first of the four mirrors (i.e., mirror 2) of the lithography projection system 1 (also see FIG. 1). Light traveling through the lithography projection system 1 is disturbed in a manner that is indicative of the alignment of the mirrors 2–5 (not specifically shown in FIGS. 5A and 5B). From the fourth mirror 5 of the system 1 (see FIG. 1), the probe beam travels to a focal spot FS of the lithography system that is located in the same x-y plane as the reflective surface 21' of the reference pin mirror 20'. The reference pin mirror can be positioned with a stage 40 to which the reference pin mirror is mounted.

At the beam splitter 36, a portion of the input light from the lens 35 passes through the beam splitter as the reference beam to the attenuator 41. The attenuator 41 reduces the intensity of the reference beam, preferably to a degree that can be adjusted, to obtain a desired fringe contrast in the interference pattern generated with the probe and reference beams in the interferometer of FIGS. 5A and 5B. From the attenuator 41, the reference beam travels to and reflects from mirror 42 that is angled in FIG. 5A about an axis parallel to the x-axis. The reference beam reflected from mirror 42 travels to focusing lens 43 that focuses the reference beam onto the reference pin mirror 20' positioned on the opposite side of the interferometer's optical axis OA from the focal spot FS (see FIG. 5B). To adjust the focus of the lens 43, a stage 44 can be used to move the lens toward or away from the reference pin mirror. The reference pin mirror diffracts and reflects the reference beam to the imaging lens 45 and detector 46 to generate the interference pattern. The detector 46 can be one of a variety of detectors such as a two-dimensional charge-coupled device (CCD) array or a charge-injection device (CID) array, and generates an electric signal such as a data frame or set with respective pixel values, based on the interference pattern. Most two-dimensional array detectors are made primarily from materials such as silicon, that are reflective. To prevent back-reflections that could disturb the reference or probe beams, the detector can be tilted slightly by 1° or 2° from a normal orientation with respect to the direction of incidence of the probe and reference beams. A computer 47 is coupled to receive the signal generated by the detector 46. The computer can be one of a wide variety of commercial devices including an Intel® 80386™ processor-based personal computer, its equivalent, or a more advanced personal computer. Preferably, the personal computer includes a video or data card (not shown) to serve as a data interface coupled to receive the signal from the detector. The computer's processor is coupled to the data interface card, and receives and stores data frames output by the detector in a memory (not shown) to which the processor is coupled. One or more data frames are defined herein as a 'data set' or 'measurement.' The computer's processor can also read and display the frame data or set from its memory on the computer's display so that a human operator can observe the interference pattern or data generated by the interferometer. Preferably, the computer's processor is also coupled via an interface (not shown) to an actuator 48 to which the mirror 42 is attached. The actuator 48 can be a piezoelectric element capable of moving the mirror 42 by relatively slight amounts on the order of the wavelength of the light generated by source 31. The computer 47 can be coupled to the actuator 48 to control the electrically-induced expansion or contraction of the actuator's piezoelectric element and hence the position of the mirror 42. Preferably, the computer captures data frames at successive increments of the actuator 48 that shifts the phase of the probe or reference beams so that the observed characteristics of the system 1 under test can be completely determined by the computer using a commercially available software package such as Opti-Code™ produced by Phase Shift Technology™, Inc. of Tuscon, Ariz., Vision™ produced by Wyko™ Corporation of Tuscon, Ariz., or MetroPro™ produced by Zygo™ Corporation of Middlefield, Conn., that treat each pixel in the detector independently of other pixels and calculate the overall surface figure and alignment characteristics of the four mirrors of the system 1 under test from the light's intensity variation during phase shifting. The pin mirror interferometer of FIGS. 5A and 5B can thus be used to detect and correct errors in the alignment of the mirrors 2–5 in the invented lithography projection system to achieve the desired mirror spacings, tilts and decenters in the system prescription as shown in FIGS. 2 or 3A and 3B, for example.

B. Mirror Surface Testing

Variations of the pin mirror interferometer of FIGS. 5A and 5B can be used to test surface shape of the individual mirrors used in the lithography projection system of the present invention. More specifically, the pin mirror interferometer embodiments of FIGS. 6A and 6B, 7, 8, and 9 can be used to test the mirrors 5, 4, 3, 2 (see FIG. 1), respectively, to determine whether such mirrors have surface shapes conforming to their prescriptions in FIGS. 2, 3A and 3B, for example. If a particular mirror is not of appropriate shape, its pin mirror interferometer can be used to determine whether the mirror is correctable, and if so, the amount and manner in which such mirror must be corrected to conform to its prescription.

The interferometer of FIGS. 6A and 6B for use in testing the mirror 5, is similar in many respects to that of FIGS. 5A and 5B. In this case, however, the probe and reference pin mirrors 20, 20' are positioned side-by-side on opposite sides of the focal spot FS generated by the mirror 5 under test (see FIG. 6B). In the interferometer of FIGS. 6A and 6B, the portion of the light used as the probe beam reflects from the interface of splitter 36, travels to and reflects from the mirror 49, and travels through the splitter 36 to the lens 37 which focuses the probe beam onto the probe pin mirror 20 positioned near the focal spot FS of the mirror 5 under test. The probe pin mirror diffracts and reflects the probe beam to the mirror 5 which reflects the probe beam back toward the pin mirrors to form the focal spot FS from which the probe beam travels to the collimating lens 45 where it is collimated and supplied to the detector 46. The probe beam is disturbed by the surface of the mirror 5 in a manner that reveals its surface shape. To extract this surface shape of mirror 5, however, an interference pattern is generated between the probe beam and a reference beam. From the lens 35, the portion of the light used as the reference beam travels through the beam splitter to the mirror 42, reflects from the mirror 42 back to the beam splitter's interface where it reflects to and travels through the lens 37 to the reference pin mirror 20' which diffracts and reflects the reference beam to the lens 45 and the detector 46 to form an interference pattern with the probe beam. The detector is coupled to the computer which can use the piezoelectric element 48 to introduce phase shift between the reference and probe beams while reading the detector's signal to compile a data set indicative of the surface shape of the mirror 5. The computer 47 can thus be used to determine whether or not the surface shape of the mirror 5 conforms to the prescribed mirror shape.

Figure 7:
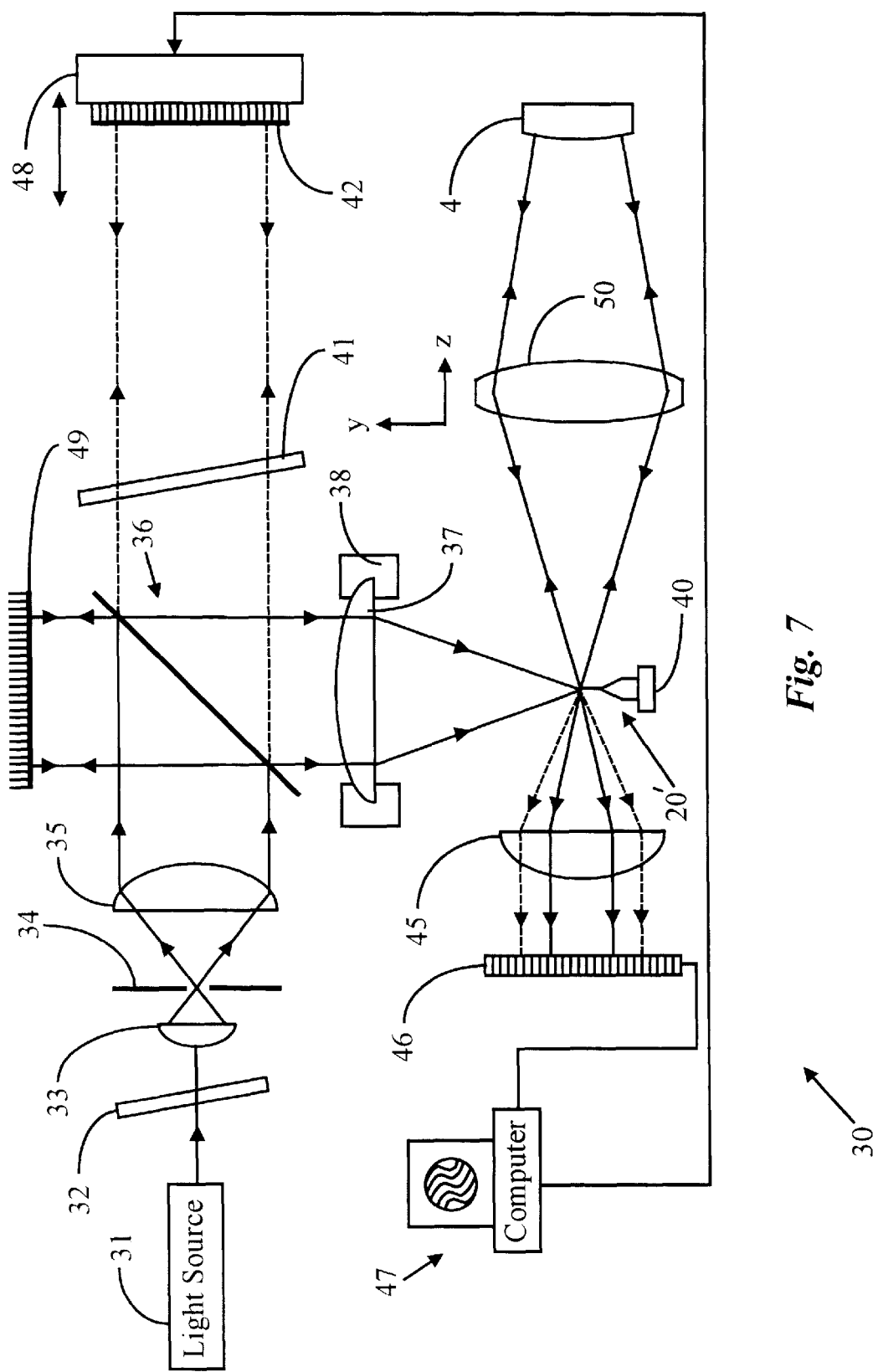

The pin mirror interferometer of FIG. 7 is used to test the surface shape of the spherical convex mirror 4. The interferometer of FIG. 7 is nearly the same as that of FIGS. 6A and 6B, except for the use of the converging lens 50 between the probe pin mirror 20 (not visible in FIG. 7, but similar to the probe pin mirror of FIG. 6B) and the convex spherical mirror 4 under test. More specifically, the converging lens 50 receives the probe beam from the probe pin mirror 20 and directs this light to the mirror 4. The converging lens also receives the probe beam reflected from the mirror 4 and focuses the probe beam to the focal spot FS (not shown in FIG. 7) between the two pin mirrors, from which the light travels to the detector 46 via lens 45 to generate the interference pattern with the reference beam.

Figure 8:
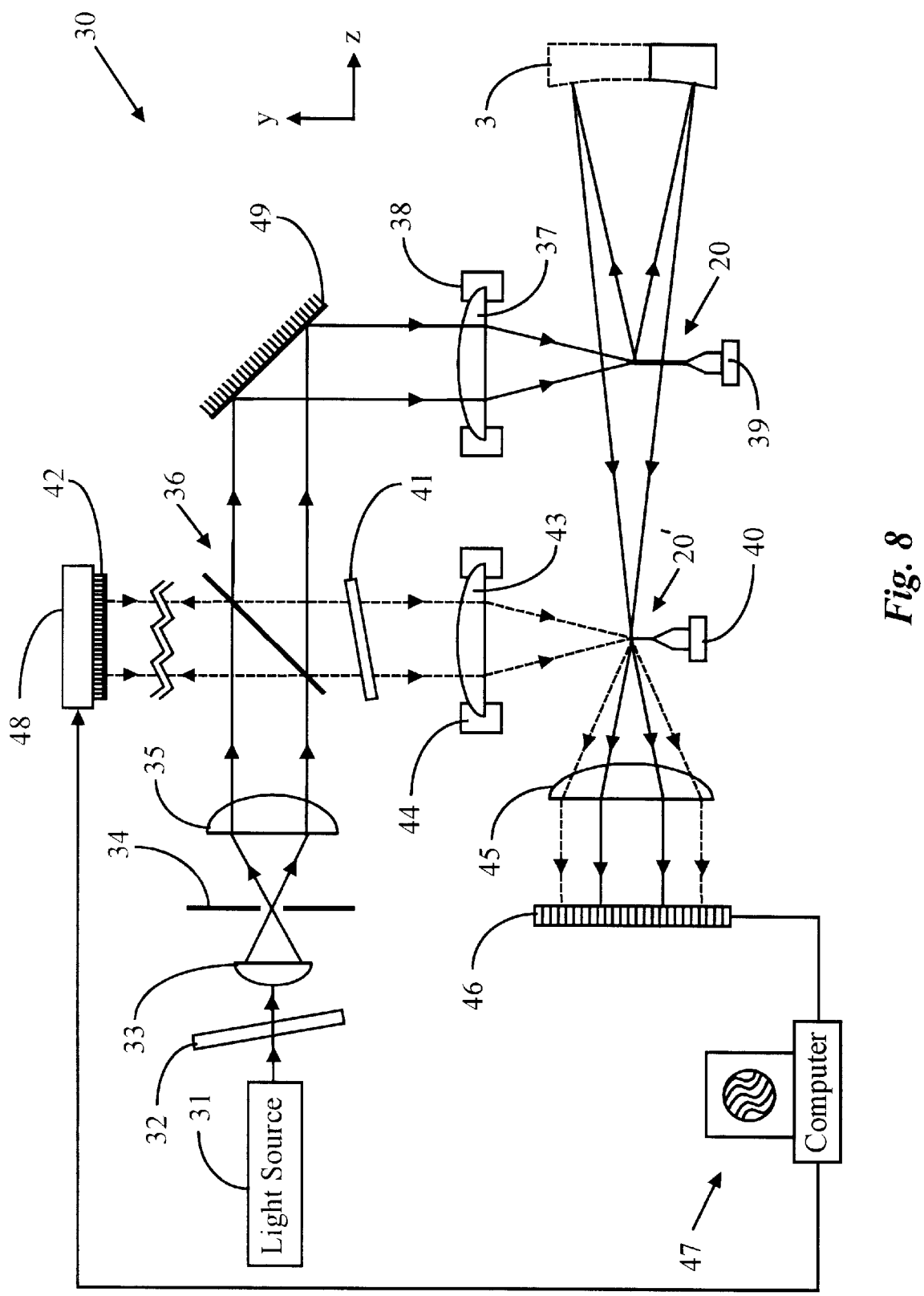

The pin mirror interferometer of FIG. 8 is used to test the surface shape of the elliptical mirror 3 which by definition has two foci. In this arrangement, the probe pin mirror 20 is positioned at the focus closest to the mirror 3, and the reference pin mirror 20' is positioned at the focus farthest from the mirror 3. The use of the pin mirror interferometer of FIG. 8 is similar in many respects to that of the previously described embodiments and generates data from the interference pattern generated between the probe and reference pin mirrors, that is indicative of whether the elliptical mirror 3 has the prescribed shape. In FIG. 8, the reference beam reflects from the interface of beam splitter 36 to mirror 42 from which it reflects back and passes through beam splitter 36 to lens 43 and then to reference pin mirror 20' which diffracts and reflects the reference beam toward the detector 46. The probe beam passes through the beam splitter 36 to mirror 49 from which it reflects and passes through the lens 37 that focuses the probe beam onto the probe pin mirror 20. The probe beam is diffracted and reflected by the probe pin mirror 20 toward the mirror 3 from which the probe beam reflects and is focused at a spot adjacent the reference pin mirror 20'. The reference and probe beams travel to the detector 46 where they interfere to generate an interference pattern. The computer is coupled to receive the detector's signal which is indicative of the interference pattern. Preferably, the computer 47 is coupled to output a signal to the piezoelectric element 48 to introduce relatively small phase-shifts between the reference and probe beams as it collects a data set from the detector 46, that is indicative of the surface shape of the mirror 3.

Figure 9:
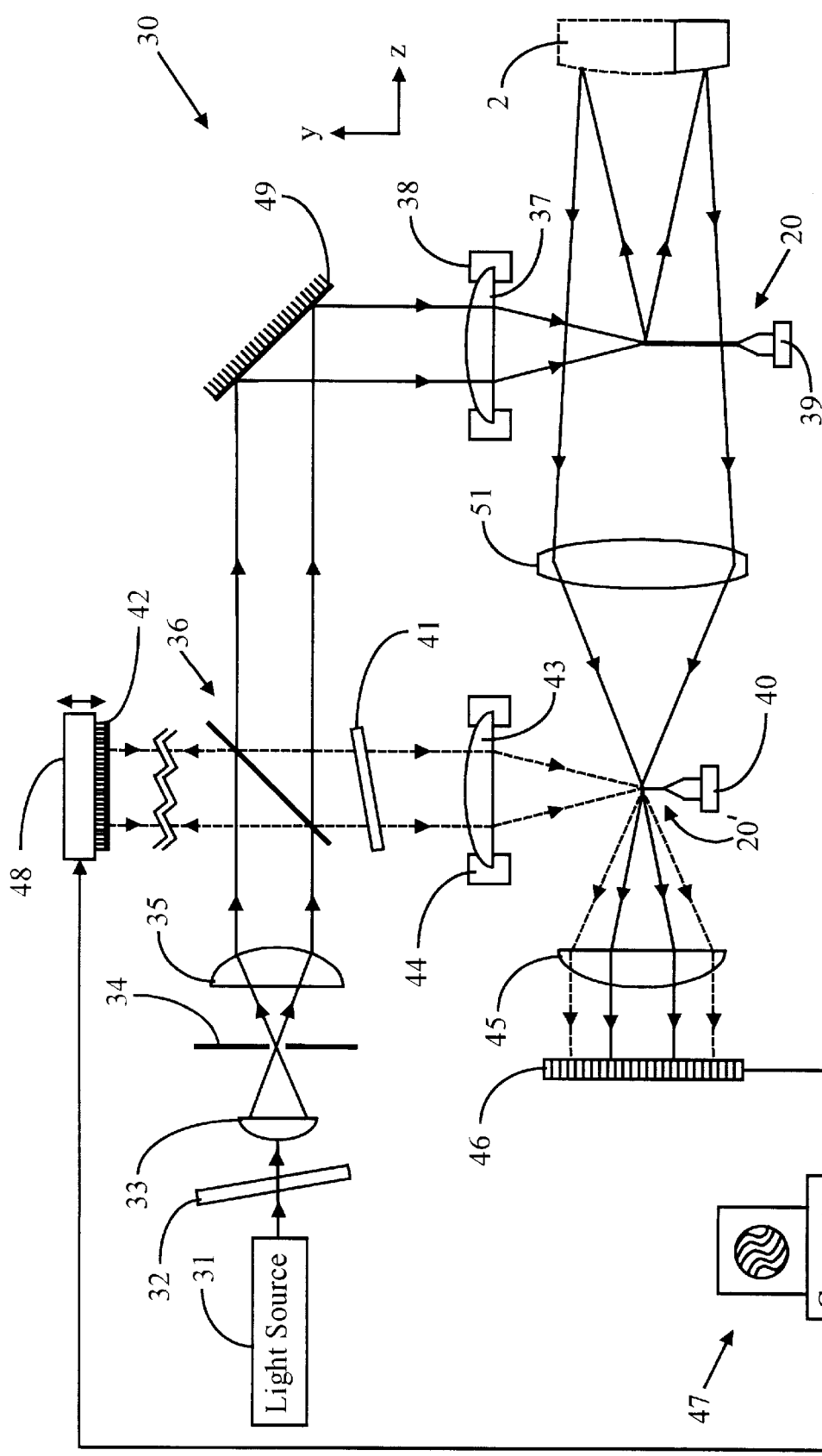

The pin mirror interferometer of FIG. 9 is used to test the surface shape of the hyperbolic mirror 2. In this embodiment, the probe pin mirror 20 is positioned at the front focus of the hyperbolic mirror 2. The interferometer of FIG. 9 also has a converging lens 51 positioned to receive the probe beam from the mirror 2 and to focus the probe beam to a focal spot (not shown in FIG. 9) that is adjacent the reference pin mirror 20'. In other respects, the use of the interferometer of FIG. 9 is most similar to the previously described interferometer of FIG. 8.

3. Operation of the Invented System

The pin mirror interferometers of FIGS. 6A, 6B, 7, 8, and 9, can be used to test and correct the surface shapes of the mirrors 2–5 (see FIG. 1), and the interferometer of FIGS. 5A and 5B can be used to align the mirrors 2–5 with respective stages 11–14 relative to the subsystem 8, the reticle stage 10 and the substrate stage 15 (see FIG. 1). Once alignment of the mirrors is achieved, the reticle 6 and substrate 7 can be loaded into respective stages 10, 15. As is well-known to persons of ordinary skill in this technology, the substrate 7 can be silicon, germanium-arsenide, or silicon-on-insulator wafer-shaped material, a mask blank or a workpiece on which micromachining is to be performed, for example, and can have a resist layer applied thereto in advance of loading the substrate into the stage 15. The stages 10, 15 are moved to respective starting positions for a scan, and the subsystem 8 is activated to direct light to the reticle 6. The stages 10, 15 are moved in tandem at rates proportional to the magnification of the lithography projection system and size of the reticle area and its corresponding substrate image area, that is to be transferred to the substrate or resist layer thereon. The stages 10, 15 can be coupled to a controller or processor (not shown) that coordinates movement of the two stages. In a typical case, the pattern scanned on the substrate can be the size of a few integrated circuit chips wide (corresponding to an image field size of a few centimeters) and may extend over several centimeters across the substrate. After an area of the substrate is scanned, the subsystem 8 is deactivated or its light blocked with an opaque shade (not shown), and the stage 15 is moved or stepped to the next starting position on the substrate. The stage 10 is controlled to return to its starting position, the subsystem 8 is again allowed to direct light to the reticle, and the scan process is repeated. This technique is known as a step-and-scan exposure procedure. After exposure with the invented system, the substrate can be removed from the substrate stage and processed. For example, the exposed resist layer on the substrate can be developed, and the substrate subjected to selective etching, chemical vapor deposition (CVD), sputtering, doping, ion milling or other techniques in a process step for forming an integrated circuit or other device. The patterned resist layer can be removed and another resist layer can be formed on the substrate which is returned to the stage 15 together with the next reticle of a mask set, that replaces the reticle previously used in the stage 10. The step-and-scan procedure can then be repeated. By continually repeating the exposure process with the reticles of a mask set using the invented system, a plurality of integrated circuit chips can be formed on the substrate. Moreover, because the invented system is capable of operation at EUV wavelengths, the feature sizes of the integrated circuits can be made on the order of 0.1 micron or less and are thus suitable for use in future generations of integrated circuits. In addition, because the substrate can be exposed by relatively rapid scanning of a large image field, the throughput of the invented system is far greater than most, and possibly all, known alternative exposure techniques. The invented system is thus an important tool for use in the generation of future integrated circuits and other devices having small feature sizes.

The many features and advantages of the present invention are apparent from the detailed specification and thus, it is intended by the appended claims to cover all such features and advantages of the described system which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

What is claimed is:

1. A system for transferring a pattern on a reticle to a substrate, the reticle illuminated with light, the system comprising:
   a dominantly hyperbolic convex mirror positioned to receive the light from the reticle, and reflecting the received light;
   a dominantly elliptical concave mirror positioned to receive the light reflected from the hyperbolic mirror, and reflecting the light received from the hyperbolic mirror;
   a first substantially spherical convex mirror positioned to receive the light reflected from the elliptical mirror, and reflecting the light received from the elliptical mirror; and
   a second approximately spherical concave mirror positioned to receive the light reflected from the first spherical mirror, and reflecting the light to the substrate.

2. A system as claimed in claim 1, further comprising:
   an aperture stop positioned at the convex spherical mirror.

3. A system as claimed in claim 1, wherein said system has an optical axis, and wherein a surface or symmetrical projection of a surface of each of the mirrors is substantially symmetrically arranged about the optical axis of the system.

4. A system as claimed in claim 1, wherein at least one of the mirrors is tilted relative to the optical axis of the system to increase the field size of the image plane at the substrate.

5. A system as claimed in claim 1, wherein at least one of the mirrors is decentered relative to the optical axis of the system to increase the field size at the substrate.

6. A system as claimed in claim 1, wherein the field size produced by the system at the substrate is at least 26 millimeters by 1.5 millimeters.

7. A system as claimed in claim 1, wherein the field size produced by the system at the substrate is at least 26 millimeters by 2.0 millimeters.

8. A system as claimed in claim 1, further comprising:
   a light source generating the light irradiated onto the reticle, the light source positioned to direct the light at an oblique angle to the surface of the reticle so that the hyperbolic convex mirror receives patterned light from the reticle at a position that is spaced apart from the light source so that the light source and hyperbolic convex mirror do not obstruct the light traveling through the system.

9. A system as claimed in claim 8, wherein the light generated by the source has a wavelength in the extreme ultraviolet (EUV) range.

10. A system as claimed in claim 1, further comprising:
    a stage holding the reticle, for positioning the reticle with respect to the light source and the hyperbolic mirror.

11. A system as claimed in claim 1, further comprising:
    a stage holding the substrate, for positioning the substrate with respect to the second spherical mirror.

12. A system as claimed in claim 11, wherein the stage is used to move the substrate in a step-and-scan fashion to produce repeated reticle patterns on the substrate.

13. A system as claimed in claim 1, further comprising:
    at least one stage having one of said mirrors mounted thereto, for positioning the one mirror with respect to at least one of the other mirrors.

14. A system as claimed in claim 1, wherein the mirrors are configured to reduce the scale of the patterned light at the substrate relative to its size at the reticle.

15. A system as claimed in claim 1, wherein at least one mirror has a multilayer reflective coating.

16. A system as claimed in claim 1, wherein the ray incidence angle of patterned light upon each of the mirror surfaces is 15° or less from normal.

17. A system as claimed in claim 1, wherein the reticle and substrate are positioned on opposite sides of the mirrors.

18. A system as claimed in claim 1, wherein the hyperbolic and elliptical mirrors are on the same side of the system's optical axis as the reticle, the spherical concave mirror is on the same side of the optical axis as the substrate, and the spherical convex mirror is positioned on the optical axis.

19. A system as claimed in claim 1, wherein, starting from the wafer substrate and ending at the reticle, the successive physical position order of mirrors along the system's optical axis is the hyperbolic mirror, the spherical convex mirror, spherical concave mirror, and the elliptical mirror.

20. A system as claimed in claim 1, wherein the shapes and the relative positions of the mirrors are determined using a gross adjustment in which the radii of curvature, fourth-order aspherical terms of mirror curvature, and relative distances between mirrors, are allowed to vary to obtain a gross optimal solution for the system, followed by a subsequent fine adjustment in which aspherical terms of the mirror curvatures higher than fourth-order are allowed to vary together with the radii of curvature, fourth-order aspherical terms of mirror curvature, and relative distances between the mirrors, to obtain optimal mirror spacings and shapes.

21. A system as claimed in claim 20, wherein tilt and decenter of the mirrors are used as additional degrees of freedom in fine optimization to increase the image field width produced by the system.

22. A system as claimed in claim 1, wherein the substrate is a semiconductor wafer.

23. A system for transferring a pattern on a reticle to a substrate, the system having an optical axis, the system comprising:
    a first, concave mirror having a radius of curvature of 400 to 600 millimeters, the first mirror positioned from 400 to 600 millimeters from the substrate in a first direction along the system's optical axis;
    a second, convex mirror having a radius of curvature of 300 to 500 millimeters, the second mirror positioned from 200 to 400 millimeters from the first mirror in a second direction along the system's optical axis, the second direction opposite to the first direction;
    a third, concave mirror having a radius of curvature of 900 to 1400 millimeters, the third mirror positioned from 400 to 600 millimeters from the second mirror in the first direction along the system's optical axis; and a fourth, convex mirror having a radius of curvature of 2000 to 6000 millimeters, the fourth mirror positioned from 500 to 800 millimeters from the third mirror in the second direction along the system's optical axis, and the distance from the fourth mirror to the reticle in a range from 800 to 1500 millimeters in the first direction;

wherein the first, second, third and fourth mirrors are decentered between the values of 1 to 5, 0 to −2, 2 to 7, and 1 to 4 millimeters, respectively, along an axis normal to the system's optical axis.

24. A system for transferring a pattern on a reticle to a substrate, the system having an optical axis, the system comprising:

a first, concave mirror having a radius of curvature of 400 to 600 millimeters, the first mirror positioned from 400 to 600 millimeters from the substrate in a first direction along the system's optical axis;

a second, convex mirror having a radius of curvature of 300 to 500 millimeters, the second mirror positioned from 200 to 400 millimeters from the first mirror in a second direction along the system's optical axis, the second direction opposite to the first direction;

a third, concave mirror having a radius of curvature of 900 to 1400 millimeters, the third mirror positioned from 400 to 600 millimeters from the second mirror in the first direction along the system's optical axis; and a fourth, convex mirror having a radius of curvature of 2000 to 6000 millimeters, the fourth mirror positioned from 500 to 800 millimeters from the third mirror in the second direction along the system's optical axis, and the distance from the fourth mirror to the reticle in a range from 800 to 1500 millimeters in the first direction;

wherein the object field at the reticle is decentered between the values of 200 to 250 millimeters along an axis normal to the optical axis.

25. A system for transferring a pattern on a reticle to a substrate, the system having an optical axis, the system comprising:

a first, concave mirror having a radius of curvature of 400 to 600 millimeters, the first mirror positioned from 400 to 600 millimeters from the substrate in a first direction along the system's optical axis;

a second, convex mirror having a radius of curvature of 300 to 500 millimeters, the second mirror positioned from 200 to 400 millimeters from the first mirror in a second direction along the system's optical axis, the second direction opposite to the first direction;

a third, concave mirror having a radius of curvature of 900 to 1400 millimeters, the third mirror positioned from 400 to 600 millimeters from the second mirror in the first direction along the system's optical axis; and a fourth, convex mirror having a radius of curvature of 2000 to 6000 millimeters, the fourth mirror positioned from 500 to 800 millimeters from the third mirror in the second direction along the system's optical axis, and the distance from the fourth mirror to the reticle in a range from 800 to 1500 millimeters in the first direction;

wherein the first, second, third and fourth mirrors are tilted between the values of 0 to 1, 0 to −1, 0 to 1, 0 to −1 degrees, respectively, about an axis orthogonal to the optical axis.

26. A system for transferring a pattern on a reticle to a substrate, the system having an optical axis, the system comprising:

a first, concave mirror having a radius of curvature of 400 to 600 millimeters, the first mirror positioned from 400 to 600 millimeters from the substrate in a first direction along the system's optical axis;

a second, convex mirror having a radius of curvature of 300 to 500 millimeters, the second mirror positioned from 200 to 400 millimeters from the first mirror in a second direction along the system's optical axis, the second direction opposite to the first direction;

a third, concave mirror having a radius of curvature of 900 to 1400 millimeters, the third mirror positioned from 400 to 600 millimeters from the second mirror in the first direction along the system's optical axis; and a fourth, convex mirror having a radius of curvature of 2000 to 6000 millimeters, the fourth mirror positioned from 500 to 800 millimeters from the third mirror in the second direction along the system's optical axis, and the distance from the fourth mirror to the reticle in a range from 800 to 1500 millimeters in the first direction;

wherein the reticle is tilted between the values of 0 to −1 degrees relative to an axis normal to the optical axis.

27. A system for projecting patterned light from a reticle to a substrate, the system comprising:

a dominantly hyperbolic convex mirror;

a dominantly elliptical concave mirror;

a dominantly spherical convex mirror; and a dominantly spherical concave mirror, the mirrors, in the stated sequence, for transferring patterned light from the reticle, through said system of mirrors, to the substrate.

28. A system as claimed in claim 27, wherein the mirrors are sections of surfaces that are axially symmetric about an optical axis of the system.

29. A system as claimed in claim 28, wherein the hyperbolic and elliptical mirrors are positioned together with the reticle on one side of the optical axis, the spherical concave mirror is positioned on the other opposite side of the optical axis together with the substrate, and the spherical concave mirror is positioned on the optical axis.

30. A system as claimed in claim 28, wherein at least one mirror is decentered relative to the optical axis to increase the image field size at the substrate.

31. A system as claimed in claim 28, wherein at least one mirror is tilted relative to the optical axis to increase the image field size at the substrate.

* * * * *

UNITED STATES PATENT AND TRADEMARK OFFICE
CERTIFICATE OF CORRECTION

PATENT NO. : 6,142,641
DATED : November 7, 2000
INVENTOR(S) : Simon J. Cohen, Hwan J. Jeong and David R. Shafer It is certified that error appears in the above-identified patent and that said Letters Patent are hereby corrected as shown below:

In column 1 at line 4, to be inserted after the title and before BACKGROUND OF THE INVENTION:

Government rights
    The United States Government has rights in this invention pursuant to Contract No. W-7405-ENG-48 between the United States Department of Energy and the University of California for the operation of Lawrence Livermore National Laboratory.

Signed and Sealed this

Fifteenth Day of May, 2001

Attest:

NICHOLAS P. GODICI

Attesting Officer     Acting Director of the United States Patent and Trademark Office